United States Patent
Lele et al.

(10) Patent No.: US 12,181,913 B2
(45) Date of Patent: Dec. 31, 2024

(54) CLOCK SYNCHRONIZATION PULSE WIDTH SCALING

(71) Applicant: TEXAS INSTRUMENTS INCORPORATED, Dallas, TX (US)

(72) Inventors: Atul Ramakant Lele, Bengaluru (IN); Paul John Patchen, Arlington, TX (US); Ryan Alexander Smith, Lucas, TX (US); Bernd Hannes Schneider, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/562,216

(22) Filed: Dec. 27, 2021

(65) Prior Publication Data

US 2023/0205256 A1 Jun. 29, 2023

(51) Int. Cl.
*G06F 1/12* (2006.01)
*H03K 21/02* (2006.01)

(52) U.S. Cl.
CPC ............ *G06F 1/12* (2013.01); *H03K 21/023* (2013.01)

(58) Field of Classification Search
None
See application file for complete search history.

(56) References Cited

U.S. PATENT DOCUMENTS

| 5,384,816 A * | 1/1995 | Prysby | H03K 23/665 |
| | | | 377/48 |
| 7,594,126 B2 * | 9/2009 | Yun | G06F 1/324 |
| | | | 713/323 |
| 2015/0311909 A1 * | 10/2015 | Tucker | H03M 1/60 |
| | | | 341/118 |
| 2021/0034095 A1 * | 2/2021 | Lele | H04J 3/0679 |

FOREIGN PATENT DOCUMENTS

KR 20160026526 A * 3/2016

* cited by examiner

*Primary Examiner* — Lincoln D Donovan
*Assistant Examiner* — James G Yeaman
(74) *Attorney, Agent, or Firm* — Xianghui Huang; Frank D. Cimino (57) ABSTRACT

An electronic circuit includes an oscillator circuit, a first divider circuit, a synchronization control circuit, and a peripheral circuit. The oscillator circuit is configured to generate a base frequency clock. The first divider circuit is configured to divide the base frequency clock by a first selectable divisor to generate a divided clock. The synchronization control circuit is configured to generate a synchronization pulse that controls a change of the first selectable divisor in the first divider circuit from a first value to a second value. A pulse width of the synchronization pulse is based on the first value of the first selectable divisor. The peripheral circuit is coupled to the first divider circuit and the synchronization control circuit. The peripheral circuit includes a second divider circuit. The second divider circuit divides the divided clock by a second selectable divisor, and change the second selectable divisor responsive to the synchronization pulse.

18 Claims, 5 Drawing Sheets

CLOCK SYNCHRONIZATION PULSE WIDTH SCALING

BACKGROUND

Some electronic systems include multiple docked components, where at least some of the individual docked components use a divider to reduce a system or root clock signal to a lower frequency dock signal for use by component sub-systems. In an example electronic system, a system-on-a-chip (SoC) circuit includes multiple components with respective clock dividers for different processor sub-systems and peripherals to enable performance and power flexibility. The power flexibility of the SoC circuit can be increased if the root clock signal is adjustable. However, such adjustments to the root clock signal are problematic in system scenarios where different component dock dividers have different divider settings and different divider output options. For example, changing the root dock by one of the components can affect the divided dock of other components.

SUMMARY

In one example, an electronic circuit includes an oscillator circuit, a first divider circuit, a synchronization control circuit, and a peripheral circuit. The oscillator circuit is configured to generate a base frequency clock. The first divider circuit is coupled to the oscillator circuit, and is configured to divide the base frequency clock by a first selectable divisor to generate a divided clock. The synchronization control circuit is coupled to the oscillator circuit and the divider circuit, and is configured to generate a synchronization pulse that controls a change of the first selectable divisor in the first divider circuit from a first value to a second value. A pulse width of the synchronization pulse is based on the first value of the first selectable divisor. The peripheral circuit is coupled to the first divider circuit and the synchronization control circuit. The peripheral circuit includes a second divider circuit. The second divider circuit is configured to divide the divided clock by a second selectable divisor, and change the second selectable divisor responsive to the synchronization pulse.

In another example, an electronic circuit includes an oscillator circuit, a first divider circuit, a peripheral circuit, and a power and clock manager circuit. The oscillator circuit is configured to generate a base frequency clock. The first divider circuit is coupled to the oscillator circuit, and is configured to divide the base frequency clock by a first selectable divisor to generate a divided clock. The peripheral circuit is coupled to the first divider circuit, and includes a second divider circuit. The second divider circuit is configured to divide the divided clock by a second selectable divisor. The power and clock manager circuit is coupled to the first divider circuit and the second divider circuit, and is configured to reduce a power supply voltage provided to the first divider and the second divider responsive to a new value of the first selectable divisor being greater than a current value of the first selectable divisor. The power and clock manager circuit is also configured to provide the new value of the first selectable divisor to the first divider circuit and the new value of the second selectable divisor to the second divider circuit prior to reduction of the power supply voltage provided to the first divider and the second divider.

In a further example, a method includes generating a base frequency clock. The base frequency clock is divided by a first selectable divisor to generate a divided clock. A synchronization pulse is generated. The first selectable divisor is changed from a first value to a second value responsive to the synchronization pulse. A pulse width of the synchronization pulse is based on the first value of the first selectable divisor. The divided clock is divided by a second selectable divisor. The second selectable divisor is changed responsive to the synchronization pulse.

BRIEF DESCRIPTION OF THE DRAWINGS

For a detailed description of various examples, reference will now be made to the accompanying drawings.

The same reference number is used in the drawings for the same or similar (either by function and/or structure) features.

DETAILED DESCRIPTION

A complex electronic circuit, such as a system-on-a-chip (SoC), may include clock circuitry that generates a base clock signal for controlling the timing of various sub-circuits. The clock circuitry may include an oscillator circuit and divider circuit. The divider circuit divides the output of the oscillator circuit to produce a divided clock. Each sub-circuit may also include divider circuitry to further divide the divided clock as needed to generate a clock frequency suitable for use in the sub-circuit.

A power and clock manager circuit controls the divisor values applied in the divider circuitry of the various sub-circuits and the clock circuitry to ensure that specified clock frequencies are provided in the sub-circuits. The clock circuitry provides a synchronization pulse to the divider circuitry of the various sub-circuits and the clock circuitry to synchronize changing of the divisor values. The power and clock manager circuit also controls the voltage powering the clock circuitry and the sub-circuits to reduce power consumption at the specified clock frequencies. The power and clock manager circuit may select the operating voltage based on the divisor values. For example, with divisor values producing a divided clock of 120 megahertz (MHz), 80 MHz, or 40 MHz, the power and clock manager circuit may set the operating voltage to 1.3 volts (V), 1.2 V, or 1.0 V respectively.

In some implementations of the clock circuitry, the synchronization pulse is provided at a predetermined clock cycle of the oscillator output (e.g., every 60th cycle of the oscillator clock), and the synchronization pulse is one period of the oscillator clock in width. For example, if the oscillator clock is running at 240 MHz, then the synchronization pulse is 4.16 nanoseconds (ns) in width. Unfortunately, when operating at lower power supply voltages to reduce power consumption, some circuitry may be unable to propagate such narrow pulses. Similarly, if the divided clock is produced by division based on pulse skipping, then the circuitry may be unable to propagate the narrow pulses of the divided clock.

The electronic circuits described herein dynamically scale the synchronization pulse width to accommodate changes in the operating voltage by setting the pulse width based on the divisor value applied in the clock circuitry. In some implementations of clock circuitry, the synchronization pulse is set to be one period of the divided clock in width. Thus, as the frequency of the divided clock and the operating voltage decrease, the synchronization pulse width increases to ensure proper operation. Furthermore, the divider circuit generates the divided clock distributed to the various sub-circuits with a 50% duty cycle (rather than as pulses gated from the oscillator clock) to ensure that the divided clock can be propagated at lower operating voltages.

The power and clock manager circuit selects the divisor values be applied in the clock circuit and the various sub-circuits, and selects the operating voltage based on the divisor values. When the power and clock manager circuit is to increase the operating voltage to accommodate a decrease in the divisor values (i.e., a faster divided clock), the power and manager circuit changes the divisor values after increasing the operating voltage. When the power and clock manager circuit is to decrease the operating voltage to accommodate an increase in the divisor values (i.e., a slower divided clock), the power and manager circuit changes the divisor values before decreasing the operating voltage. When changing the divisor values, the power and clock manager circuit provides the new divisor values to the clock circuitry and the sub-circuits between synchronization pulses to allow all of the clock dividers to apply the new divisor values responsive to the same synchronization pulse, i.e., to allow simultaneous application of the new divisor values to produce the desired operating frequencies in the sub-circuits.

Figure 1:
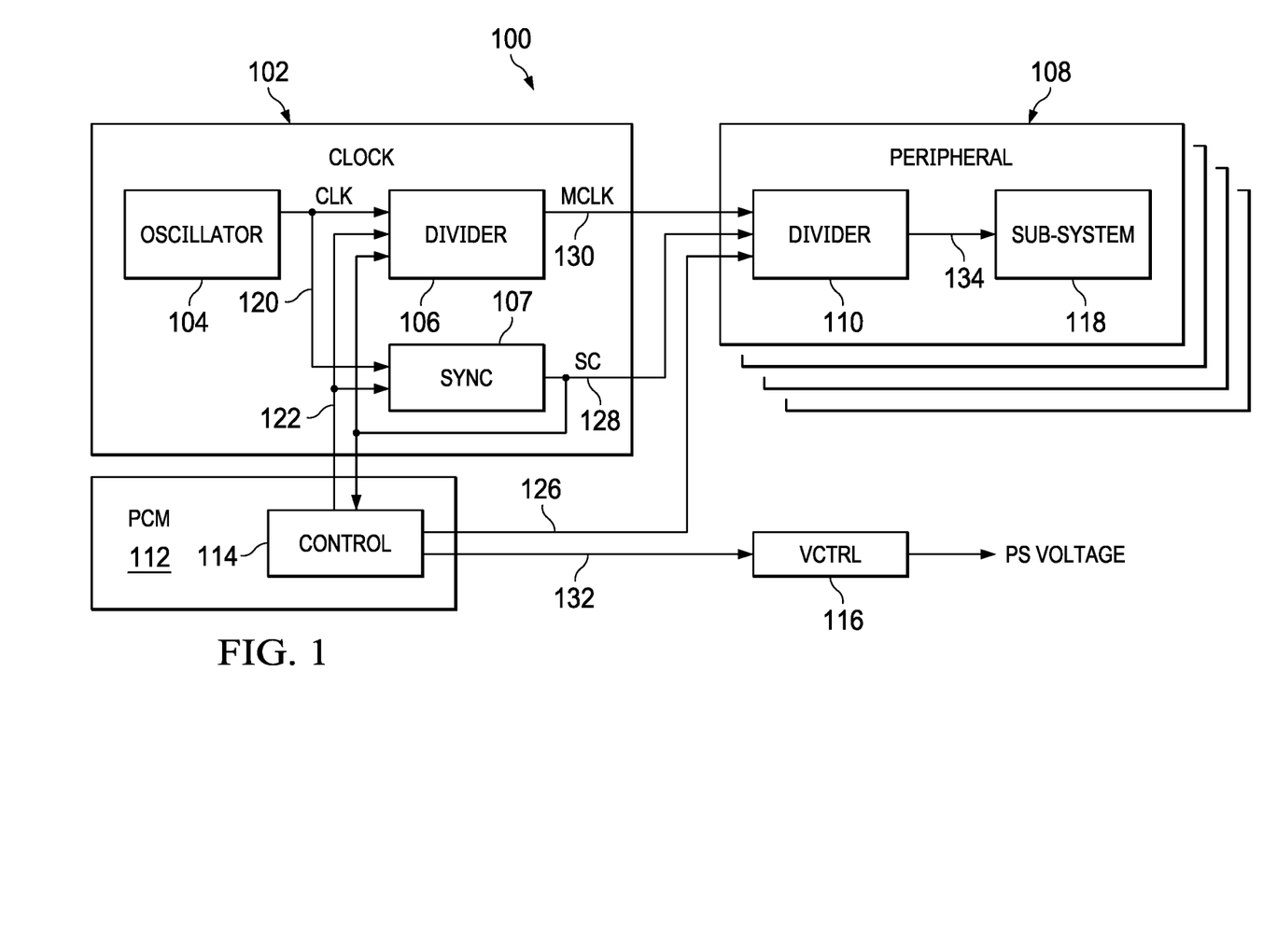
FIG. 1 is a block diagram for an example electronic circuit that includes clock divider synchronization with synchronization pulse width based on the divisor value.

FIG. 1 is a block diagram for an example electronic circuit 100 that includes clock divider synchronization where the synchronization pulse width is based on the divisor value applied in the clock divider. The electronic circuit 100 may be implemented as an SoC in some examples. The electronic circuit 100 includes a clock circuit 102, a power and clock manager circuit 112, one or more peripheral circuits 108, and a voltage control circuit 116. The voltage control circuit 116 provides the power supply voltages that power the clock circuit 102, the peripheral circuits 108, the power and clock manager circuit 112, and other circuits of the electronic circuit 100. The voltage control circuit 116 may include circuitry to generate the power supply voltages and/or circuitry to select power supply voltages generated external to the electronic circuit 100.

The clock circuit 102 includes an oscillator circuit 104, a global divider circuit 106, and a synchronization control circuit 107. The oscillator circuit 104 may include a digitally-controlled oscillator, a voltage-controlled oscillator, a phase-locked loop, and/or other clock generation circuitry that generates a base frequency clock 120 (CLK). The oscillator circuit 104 is coupled to the global divider circuit 106 and the synchronization control circuit 107. The global divider circuit 106 divides the base frequency clock 120 by a selectable divisor to generate a main divided clock 130 (MCLK). The power and clock manager circuit 112 determines the value of the selectable divisor and provides the selectable divisor to the global divider circuit 106. For example, the power and clock manager circuit 112 may determine the value of the selectable divisor to minimize the frequency of the main divided clock 130 given the operating frequencies of the peripheral circuits 108.

Each of the peripheral circuits 108 may include a local divider circuit 110 and a sub-system 118. The local divider circuit 110 divides the main divided clock 130 based on a programmable divisor received from the power and clock manager circuit 112 to generate a local or component clock signal 134 for controlling the sub-system 118. The values of the programmable divisor applied in each peripheral circuit 108 may differ to accommodate the desired clock frequency of the particular sub-system 118. The sub-system 118 may include a processor (e.g., a microprocessor core, memory, and associated peripherals) and/or other circuitry that applies a clock signal to control operation.

Returning now the clock circuit 102, the synchronization control circuit 107 generates a synchronization pulse 128 (SC) that the global divider circuit 106 and the local divider circuit 110 apply to control the application of new divisor values. That is, the synchronization pulse 128 synchronizes the change of divisor values in the global divider circuit 106 and the local divider circuit 110 to ensure that the desired clock frequency is provided to the sub-system 118 when the divisor values applied in the global divider circuit 106 and the local divider circuit 110 are being changed. The synchronization control circuit 107 varies the width of the synchronization pulse 128 based on the period of the main divided clock 130 (i.e., based on the divisor value applied in the global divider circuit 106 to generate the main divided clock 130). The pulse width of the synchronization pulse 128 may be equal to the period of the main divided clock 130. Thus, the synchronization pulse 128 is wider with greater values of the divisor applied in the global divider circuit 106, and narrower with smaller values of the divisor applied in the global divider circuit 106. The variation in width of the synchronization pulse 128 ensures that the synchronization pulse 128 is properly propagated through circuitry of the electronic circuit 100 at the power supply voltage provided by the voltage control circuit 116.

Similarly, the global divider circuit 106 generates the main divided clock 130 with a 50% duty cycle (or about a 50% duty cycle) to avoid overly narrow clock pulses, and ensure that the main divided clock 130 is properly propagated through the circuitry of the electronic circuit 100. For example, the global divider circuit 106 may include a counter circuit that is incremented on both rising and falling edges of the base frequency clock 120 to provide a 50% duty cycle main divided clock 130 with even and odd divisors.

The power and clock manager circuit 112 includes a control circuit 114 that provides the divisor values to the global divider circuit 106 and the local divider circuit 110 via control signals 122 and 126, and controls the power supply voltage provided by the voltage control circuit 116 via control signal 132. The power and clock manager circuit 112 may select the divisors and the power supply voltage to minimize power consumption of the electronic circuit 100 by minimizing the frequency of the main divided clock 130 and the power supply voltage, while maintaining the desired operating frequencies in each of the peripheral circuits 108. The power supply voltage may be selected based on the frequency of the main divided clock 130 (e.g., based on the divisor applied in the global divider circuit 106). The control circuit 114 may include a finite state machine and/or other circuitry that controls the sequencing of divisor changes relative to power supply voltage changes. When the control circuit 114 changes the power supply voltage responsive to a change in the divisors, the control circuit 114 may sequence changes in the divisors and power supply voltages such that the divisors are changed while using a higher power supply voltage. For example, if the divisor applied in the global divider circuit 106 is to be reduced, thereby increasing the frequency of the main divided clock 130 and power supply voltage, the control circuit 114 may increase the power supply voltage before changing the divisor. If the divisor applied in the global divider circuit 106 is to be increased, reducing the frequency of the main divided clock 130 and power supply voltage, the control circuit 114 may decrease the power supply voltage after changing the divisor.

The control circuit 114 is coupled to the synchronization control circuit 107 for receipt of the synchronization pulse 128. The control circuit 114 provides the divisors to the global divider circuit 106 and the local divider circuit 110 between two successive synchronization pulses 128. For example, the power and clock manager circuit 112 selects the divisors to be provided to the global divider circuit 106 and local divider circuit 110, and on receipt of a first synchronization pulse 128 the control circuit 114 provides the divisors to the global divider circuit 106 and the local divider circuit 110 before receipt of a second synchronization pulse 128 that immediately follows the first synchronization pulse 128. The global divider circuit 106 and the local divider circuit 110 apply the new divisors on receipt of the second synchronization pulse 128.

Figure 2:
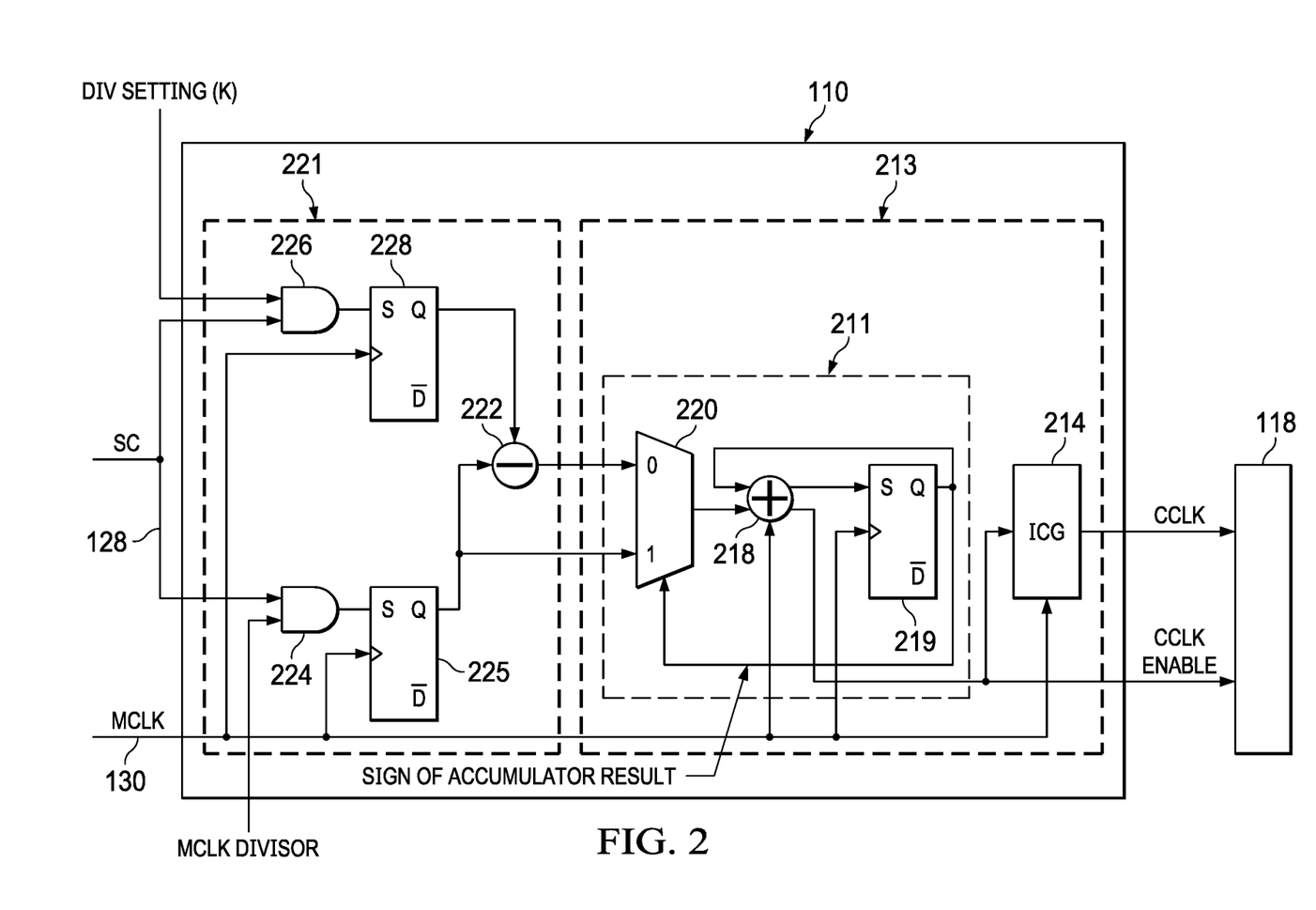
FIG. 2 is a block diagram for a divider circuit suitable for use in a peripheral circuit of the electronic circuit of FIG. 1.

FIG. 2 is a block diagram for an example of the local divider circuit 110 suitable for use in the peripheral circuits 108. The local divider circuit 110 includes a divider 213 and a sync circuit 221. The divider 213 includes a clock gate 214 and a clock gate controller 211 coupled to the clock gate 214. The clock gate 214 may be an integrated clock gating (ICG) cell. The clock gate controller 211 includes a multiplexer 220 coupled to the sync circuit 221. In operation, the multiplexer 220 selects one of two values provided by a latch 225 and a combine circuit 222. The output of the multiplexer 220 is input to an accumulator 218 of the clock gate controller 211. The output of the accumulator 218 is provided to a latch 219, which is clocked by the main divided clock 130. The output of the latch 219 is provided as one of the inputs to the accumulator 218. The accumulator 218 also provides an output (CCLK enable) to the clock gate 214 and to the sub-system 118. In some examples, when the output of the accumulator is greater than zero, the CCLK enable signal causes the clock gate 214 to pass one pulse of the main divided clock 130 as the component clock signal 134 (CCLK).

The timing for providing the two inputs to the multiplexer 220 is controlled by the sync circuit 221. More specifically, in some examples, the sync circuit 221 includes AND gates 224 and 226 coupled to the synchronization control circuit 107 of the clock circuit 102. When the synchronization pulse 128 from the synchronization control circuit 107 is high, the AND gate 226 passes K (the component clock divider integer setting) received from the power and clock manager circuit 112 to a latch 228 clocked by the main divided clock 130. Also, when the synchronization pulse 128 is high, the AND gate 224 passes MCLK DIVISOR (the divisor value provided to the global divider circuit 106 by the power and clock manager circuit 112) to a latch 225 clocked by the main divided clock 130. The outputs of the latches 228 and 225 are provided to a combine circuit 222, which provides the difference between MCLK DIVISOR and K as one of the inputs to the multiplexer 220. The other input to the multiplexer 220 is MCLK DIVISOR, which is provided by the latch 225.

To summarize, the sync circuit 221 controls when MCLK DIVISOR or the difference between MCLK DIVISOR and K is provided to the multiplexer 220 of the divider 213. The control signal for the multiplexer 220 is the sign of the accumulator output. Thus, when the accumulator output is non-negative (the sign to the multiplexer 220 is zero), the difference between MCLK DIVISOR and K is provided to the accumulator 218. Also, when the accumulator output is negative (the sign to the multiplexer 220 is one), MCLK DIVISOR is provided to the accumulator 218.

In some examples, synchronization operations result in the value of K being adjusted so that the frequency of CCLK stays the same when the frequency of the main divided clock 130 is changed. In other examples, synchronization operations result in the value of K being adjusted so that a frequency of CCLK increases relative to the frequency of CCLK before a given change in the frequency of the main divided clock 130. In other examples, the synchronization operations result in the value of K being adjusted so that a frequency of CCLK decreases relative to the frequency of CCLK before the frequency of the main divided clock 130 is changed. In these different examples, the clock gate controller 211 is configured to control when the clock gate 214 passes a pulse or positive clock edge of the main divided clock 130 as a pulse or positive clock edge of CCLK.

In the example of FIG. 2, the control signal for the clock gate 214 is managed by the accumulator 218. In some examples, only a non-negative output of the accumulator 218 causes the divider 213 to produce a CCLK pulse. In some examples, the accumulator 218 outputs an accumulator value that is a function of a number of values available for the clock generator divider integer setting, a number of values available for each respective component clock divider integer setting (assume there are two or more component clock dividers), an alignment position of the input clock signal to the clock generator 202, the main divided clock 130 (MCLK) output from the clock circuit 102, and any component clock divider outputs (CCLKs). As previously discussed, the accumulator 218 receives an input from the multiplexer 220, where the multiplexer 220 passes one of two inputs to the accumulator 218 based on the sign of the output of the accumulator 218. In other sync scenarios, a plurality of component clock dividers, similar to the divider 213, and respective outputs are synced to an update of the main divided clock 130.

To summarize, each instance of the component clock divider 213 uses an accumulator 218 to track and control the clock frequency output for a particular sub-system 118 irrespective of changes in the frequency of the main divided clock 130. More specifically, each component clock divider 213 is configured to receive the clock generator divider integer setting (e.g., MCLK DIVISOR) related to the main divided clock 130, and to track requested updates to the main divided clock 130. Each component clock divider 213 is also configured to receive the divisor value (K) fora component (e.g., a sub-system 118). If the value of MCLK DIVISOR changes, each component clock divider 213 is configured to account for the change in MCLK DIVISOR by adjusting their respective values of K. In some examples, synchronization between updates to MCLK DIVISOR and each respective K is done at a specific time or clock edge to avoid an unwanted number of clock edges (extra clock edges or fewer clock edges relative to a target) and to provide the same average frequency intended as an output for each component clock divider 213.

Figure 3:
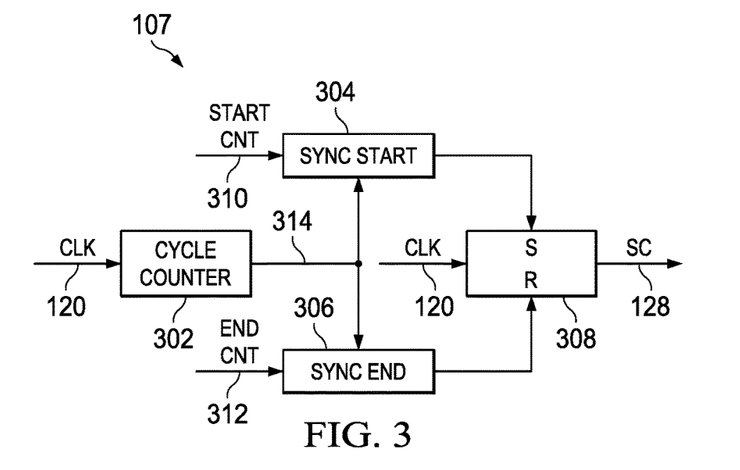
FIG. 3 is a block diagram for a synchronization pulse generation circuit suitable for use in the electronic circuit of FIG. 1.

FIG. 3 is a block diagram for an example of the synchronization control circuit 107. The synchronization control circuit 107 generates the synchronization pulse 128 with a width corresponding to the period of the main divided clock 130 at the time the synchronization pulse 128 is produced. The synchronization pulse 128 triggers updating of the divisors in the global divider circuit 106 and the local divider circuit 110 to synchronize changes in the global divider circuit 106 and the local divider circuit 110. The synchronization control circuit 107 includes a cycle counter 302, a sync pulse start comparator 304, a sync pulse end comparator 306, and sync pulse flip-flop 308. The cycle counter 302 is coupled to the oscillator circuit 104, and counts cycles of the base frequency clock 120.

The sync pulse start comparator 304 is coupled to the cycle counter 302, and compares the count output of the cycle counter 302 to a start count value 310 that specifies the count output 314 of the cycle counter 302 at which a synchronization pulse is to start (a leading edge of the synchronization pulse is to generated). The start count value 310 may be provided by the power and clock manager circuit 112 or from a look-up table or other logic based on the value of the divisor currently applied in the global divider circuit 106. An output of the sync pulse start comparator 304 is coupled to a set input of the sync pulse flip-flop 308. When the count output 314 of the cycle counter 302 is equal to the start count value 310, the sync pulse flip-flop 308 sets the synchronization pulse 128 high at an edge of the base frequency clock 120 corresponding to a rising edge of the main divided clock 130.

The sync pulse end comparator 306 is coupled to the cycle counter 302, and compares the count output of the cycle counter 302 to an end count value 312 that specifies the count output 314 of the cycle counter 302 at which a synchronization pulse is to end (a trailing edge of the synchronization pulse is to generated). The end count value 312 may be provided by the power and clock manager circuit 112 or from a look-up table or other logic based on the value of the divisor currently applied in the global divider circuit 106. An output of the sync pulse end comparator 306 is coupled to a reset input of the sync pulse flip-flop 308. When the count output 314 of the cycle counter 302 is equal to the end count value 312, the sync pulse flip-flop 308 resets the synchronization pulse 128 low at an edge of the base frequency clock 120 corresponding to a rising edge of the main divided clock 130.

In some implementations of the synchronization control circuit 107, the cycle counter 302 is configured to repeatedly count 60 cycles of the base frequency clock 120 (e.g., count from 0 to 59, reset to 0, . . . ). In this example, the end of the synchronization pulse 128 is triggered when the count output 314 is 59 (i.e., the end count value 312 is set to 59), and the start of the synchronization pulse 128 is triggered at a cycle count determined by the current divisor applied in the global divider circuit 106. For example, for divisor values of 2, 3, 4, 5, and 6 applied in the global divider circuit 106, the start count value 310 will be set to 57, 56, 55, 54, and 53 respectively.

Figure 4:
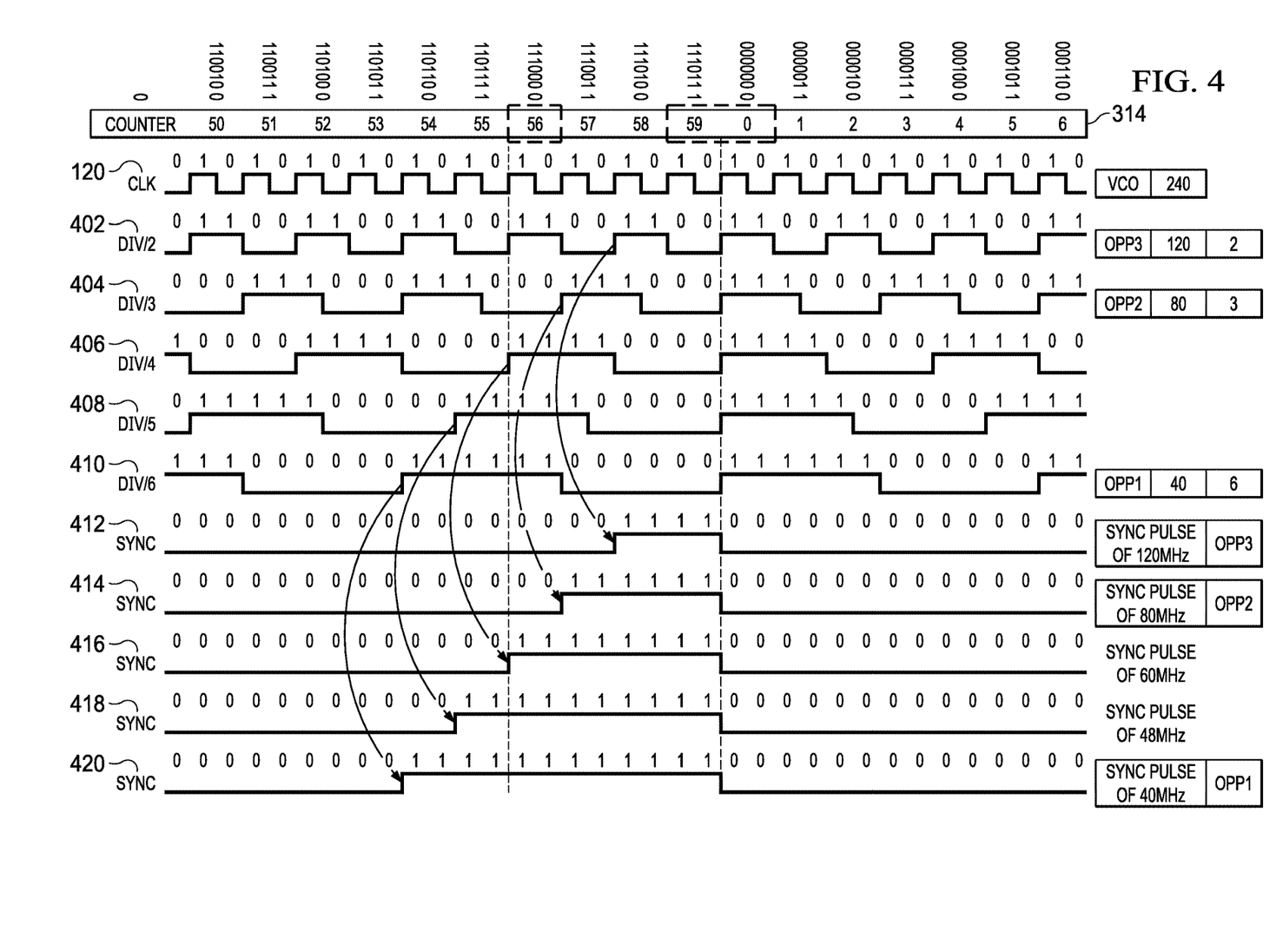
FIG. 4 is a timing diagram show variable width synchronization pulses generated by the synchronization pulse generation circuit of FIG. 3.

FIG. 4 is a timing diagram showing variable width synchronization pulses generated by the synchronization control circuit 107. FIG. 4 shows the base frequency clock 120 and the count output 314 above the base frequency clock 120. Instances of the main divided clock 130 for divisor values of 2, 3, 4, 5, and 6 are shown as divided clocks 402, 404, 406, 408, and 410 respectively. Instances of the synchronization pulse 128 corresponding the different periods of the main divided clock 130 are shown as synchronization pulses 412, 414, 416, 418, and 420. The synchronization pulses 412, 414, 416, 418, and 420 respectively correspond to the divided clocks 402, 404, 406, 408, and 410. All of the synchronization pulses 412, 414, 416, 418, and 420 end at a cycle of the base frequency clock 120 corresponding to a value of the 59 of the count output 314. The synchronization pulse 412 starts at a cycle of the base frequency clock 120 corresponding to a value of 57 of the count output 314. The synchronization pulse 414 starts at a cycle of the base frequency clock 120 corresponding to a value of 56 of the count output 314. The synchronization pulse 416 starts at a cycle of the base frequency clock 120 corresponding to a value of 55 of the count output 314. The synchronization pulse 418 starts at a cycle of the base frequency clock 120 corresponding to a value of 54 of the count output 314. The synchronization pulse 420 starts at a cycle of the base frequency clock 120 corresponding to a value of 53 of the count output 314.

FIG. 4 also illustrates synchronization of the global divider circuit 106 to the synchronization pulse 128 such that a cycle of the main divided clock 130 ends at count 59 of the count output 314, and a cycle of the main divided clock 130 starts at count 0 of the count output 314. All of the values of the divisor applied in the global divider circuit 106 may be integer factors of 60 to produce an integer number cycles over the 60 counts of the base frequency clock 120 measured by the cycle counter 302. Similarly, all values of the divisor applied in the local divider circuit 110 may be integer factors of 60.

In the example of FIG. 4, the base frequency clock 120 has a frequency 240 MHz, where N is the minimum of all clock divisors used for different instances of the sub-system 118. In this example (where the base frequency clock 120 is 240 MHz), the divisor values for the sub-system 118 could be any of 1, 2, 3, 4, 5, 6, 10, 12, 15, 20, 30, which are factors of 60. Also, N is the minimum of all such values {K1 . . . Km}, where m is number of local divider circuit 110 in the system. If K1=2, K2=2, K3=20, K4=30, K5=12, . . . , Km=15, then N=Min {2, 2, 20, 30, 12, 15}=2. Accordingly, in the above example, MCLK=240 MHz/2=120 MHz, and the clock output of K5=20 MHz which is 240 MHz/12. As another example, if K1=6, K2=6, K3=20, K4=30, K5=12, . . . , Km=15, then N=Min {6, 6, 20, 30, 12, 15}=6. Accordingly, in the above example, MCLK=240 MHz/6=40 MHz, and the clock output of K5 is 20 MHz, which is 240 Mhz/12.

FIG. 4 further shows that different power supply voltages may be selected to power the electronic circuit 100 based on the frequency of the main divided clock 130 (e.g., the value of the selectable divisor applied to generate the main divided clock 130). For example, when using the divided clock 410, the local divider circuit 110 may be powered using a first power supply voltage (OPP1) (e.g., 1 volt). When using the divided clock 404, the local divider circuit 110 may be powered by a second power supply voltage (OPP2) (e.g., 1.2 volt). When using the divided clock 402, the local divider circuit 110 may be powered by third power supply voltage (OPP3) (e.g., 1.3 volt).

Figure 5:
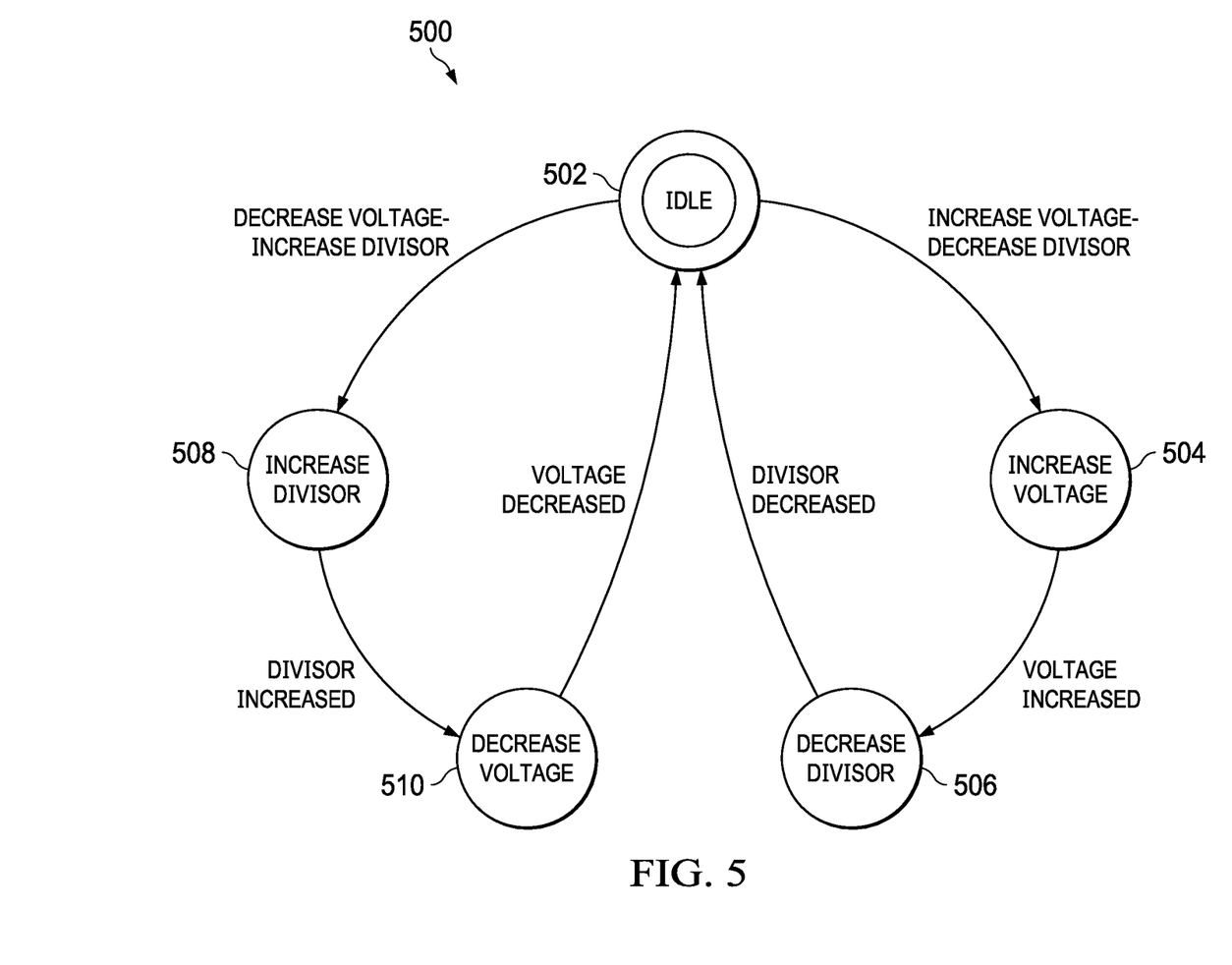
FIG. 5 is a state diagram for controlling power supply voltage and clock divisor changes in the electronic circuit of FIG. 1.

FIG. 5 is an example state diagram 500 illustrating control of power supply voltage and clock divisor changes in the electronic circuit 100. The operations illustrated in the state diagram 500 may be implemented by a finite state machine of the control circuit 114. The operations of the state diagram 500 change the divisor applied in the global divider circuit 106 at the higher of a power supply voltage corresponding to the current divisor or a power supply voltage corresponding to the new divisor to ensure proper clock propagation in the electronic circuit 100. In state 502 (IDLE) the control circuit 114 is waiting to receive information indicating that the divisor applied in the global divider circuit 106 is to be changed (increased or decreased). When a change in the divisor applied in the global divider circuit 106 is requested, the change in the divisor may trigger a change in the power supply voltage powering the electronic circuit 100. For example, if the divisor is to be decreased, resulting in an increased frequency of the main divided clock 130, then the power supply voltage may be increased to facilitate the higher frequency operation. Similarly, if the divisor is to be increased, result in a decreased frequency of the main divided clock 130, then the power supply voltage may be decreased to reduce power consumption.

If the control circuit 114 determines that the divisor is to be decreased and the power supply voltage is to be increased, then the state diagram 500 transitions from the state 502 to the state 504. In the state 504, the control circuit 114 triggers the voltage control circuit 116 to increase the power supply voltage. When the power supply voltage has been increased, the state diagram 500 transitions from the state 504 to the state 506. In the state 506, the control circuit 114 provides to the global divider circuit 106, between two consecutive instances of the synchronization pulse 128 (two consecutive activations of the synchronization pulse 128), a divisor value that is less than the current divisor value applied in the global divider circuit 106. The global divider circuit 106 applies the lower divisor value at the next synchronization pulse 128, and the state diagram 500 transitions from the state 506 to the state 502.

If the control circuit 114 determines that the divisor is to be increased and the voltage is to be decreased, then the state diagram 500 transitions from the state 502 to the state 508. In the state 508, the control circuit 114 provides to the global divider circuit 106, between two consecutive instances of the synchronization pulse 128, a divisor value that is greater than the current divisor applied in the global divider circuit 106. The global divider circuit 106 applies the larger divisor value at the next synchronization pulse 128, and the state diagram 500 transitions from the state 508 to the state 510. In the state 510, the control circuit 114 triggers the voltage control circuit 116 to decrease the power supply voltage. When the power supply voltage has been reduced, the state diagram 500 transitions from the state 510 to the state 502.

Figure 6:
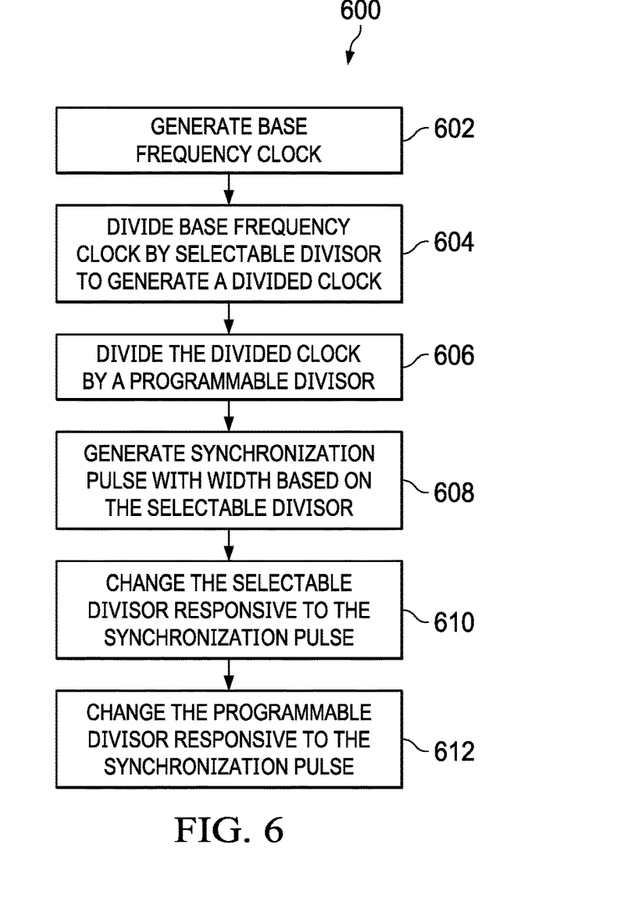
FIG. 6. is a flow diagram for a method for synchronizing clock divisor changes in an electronic circuit.

FIG. 6. is a flow diagram for a method 600 for synchronizing clock divisor changes in the electronic circuit 100. Though depicted sequentially as a matter of convenience, at least some of the actions shown can be performed in a different order and/or performed in parallel. Additionally, some implementations may perform only some of the actions shown. Operations of the method 600 may be performed by the electronic circuit 100.

In block 602, the oscillator circuit 104 generates the base frequency clock 120 having a desired frequency (e.g., 240 MHz as shown in FIG. 4).

In block 604, the global divider circuit 106 divides the base frequency clock 120 by a selectable divisor to generate a main divided clock 130.

In block 606, the local divider circuit 110 divides the main divided clock 130 by a programmable divisor to generate a component clock signal 134 for use by the sub-system 118.

In block 608, the synchronization control circuit 107 generates the synchronization pulse 128 with a pulse width based on the selectable divisor applied in the global divider circuit 106. For example, smaller values of the selectable divisor produce a synchronization pulse 128 having a smaller pulse width, and larger values of the selectable divisor produce a synchronization pulse 128 having a larger pulse width. The pulse width of the synchronization pulse 128 is equal to the period of the main divided clock 130 in some implementations of the synchronization control circuit 107.

In block 610, responsive to the synchronization pulse generated in block 606, the global divider circuit 106 changes the selectable divisor applied by the global divider circuit 106 to generate the main divided clock 130.

In block 612, responsive to the synchronization pulse generated in block 606, the local divider circuit 110 changes the programmable divisor applied by the local divider circuit 110 to generate the component clock signal 134.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device.

Circuits described herein are reconfigurable to include additional or different components to provide functionality at least partially similar to functionality available prior to the component replacement.

Unless otherwise stated, "about," "approximately," or "substantially" preceding a value means +/−10 percent of the stated value. Modifications are possible in the described examples, and other examples are possible within the scope of the claims.

What is claimed is:

1. An electronic circuit, comprising:
   an oscillator circuit configured to generate a first clock;
   a first divider circuit coupled to the oscillator circuit, and configured to divide the first clock by a first selectable divisor to generate a divided clock;
   a synchronization control circuit coupled to the oscillator circuit and the first divider circuit, and configured to generate a synchronization pulse; and
   a second divider circuit configured to divide the divided clock by a second selectable divisor,
   wherein the synchronization pulse synchronizes changes of the first and second selectable divisors, such that the first and second divider circuits are configured to change respectively a value of the first selectable divisor and a value of the second selectable divisor responsive to the synchronization pulse, and
   wherein a pulse width of the synchronization pulse that synchronizes the changes of the first and second selectable divisors corresponds to a period of the divided clock of the first divider circuit.

2. The electronic circuit of claim 1, further comprising:
a power and clock manager circuit coupled to the first divider circuit and the second divider circuit, and configured to provide a new value of the first selectable divisor to the first divider circuit and provide a new value of the second selectable divisor to the second divider circuit at a predetermined time between consecutive activations of the synchronization pulse.

3. The electronic circuit of claim 2, wherein the power and clock manager circuit is configured to reduce a power supply voltage provided to the first divider circuit and the second divider circuit responsive to the value of the first selectable divisor being increased.

4. The electronic circuit of claim 3, wherein the power and clock manager circuit is configured to provide the new value of the first selectable divisor to the first divider circuit and the new value of the second selectable divisor to the second divider circuit prior to reduction of the power supply voltage provided to the first divider circuit and the second divider circuit.

5. The electronic circuit of claim 1, further comprising:
a power and clock manager circuit coupled to the first divider circuit and the second divider circuit, and configured to increase a power supply voltage provided to the first divider circuit and the second divider circuit responsive to the value of the first selectable divisor being decreased.

6. The electronic circuit of claim 5, wherein the power and clock manager circuit is configured to provide a new value of the first selectable divisor to the first divider circuit and a new value of the second selectable divisor to the second divider circuit after increase of the power supply voltage provided to the first divider circuit and the second divider circuit.

7. The electronic circuit of claim 1, wherein:
a trailing edge of the synchronization pulse corresponds to an end of a cycle of the divided clock;
the cycle of the divided clock ends at an end of a predetermined number of cycles of the first clock; and
a leading edge of the synchronization pulse corresponds to a start of the cycle of the divided clock.

8. An electronic circuit, comprising:
an oscillator circuit configured to generate a first clock;
a first divider circuit coupled to the oscillator circuit, and configured to divide the first clock by a first selectable divisor to generate a divided clock;
a peripheral circuit coupled to the first divider circuit, and comprising:
a second divider circuit configured to divide the divided clock by a second selectable divisor; and
a power and clock manager circuit coupled to the first divider circuit and the second divider circuit, and configured to:
reduce a power supply voltage provided to the first divider circuit and the second divider circuit responsive to a new value of the first selectable divisor being greater than a current value of the first selectable divisor; and
provide the new value of the first selectable divisor to the first divider circuit and a new value of the second selectable divisor to the second divider circuit prior to reduction of the power supply voltage provided to the first divider circuit and the second divider circuit.

9. The electronic circuit of claim 8, wherein the power and clock manager circuit is configured to increase the power supply voltage provided to the first divider circuit and the second divider circuit responsive to the new value of the first selectable divisor being less than the current value of the first selectable divisor.

10. The electronic circuit of claim 9, wherein the power and clock manager circuit is configured to provide the new value of the first selectable divisor to the first divider circuit and the new value of the second selectable divisor to the second divider circuit after increase of the power supply voltage provided to the first divider circuit and the second divider circuit.

11. The electronic circuit of claim 8, further comprising:
a synchronization control circuit coupled to the oscillator circuit and the first divider circuit, and configured to generate a synchronization pulse that controls a change of the first selectable divisor in the first divider circuit from the current value to the new value;
wherein:
a pulse width of the synchronization pulse is based on the current value of the first selectable divisor; and
the second divider circuit is configured to replace a current value of the second selectable divisor with the new value of the second selectable divisor responsive to the synchronization pulse.

12. The electronic circuit of claim 11, wherein the pulse width of the synchronization pulse is equal to a period of the divided clock.

13. The electronic circuit of claim 11, wherein the power and clock manager circuit is configured to provide the new value of the first selectable divisor to the first divider circuit and provide the new value of the second selectable divisor to the second divider circuit at a predetermined time between consecutive activations of the synchronization pulse.

14. A method, comprising:
generating a first clock;
dividing the first clock by a first selectable divisor to generate a divided clock;
generating a synchronization pulse, wherein a pulse width of the synchronization pulse corresponds to a period of the divided clock;
dividing the divided clock by a second selectable divisor; and
changing a value of the first selectable divisor and a value of the second selectable divisor responsive to the synchronization pulse.

15. The method of claim 14, further comprising:
providing a new value of the first selectable divisor to a first divider circuit and providing a new value of the second selectable divisor to a second divider circuit at a predetermined time between consecutive activations of the synchronization pulse.

16. The method of claim 15, further comprising:
reducing a power supply voltage provided to the first divider circuit and the second divider circuit responsive to the value of the first selectable divisor being increased.

17. The method of claim 16, further comprising:
providing the new value of the first selectable divisor to the first divider circuit and the new value of the second selectable divisor to the second divider circuit prior to reducing the power supply voltage provided to the first divider circuit and the second divider circuit.

18. The method of claim 15, further comprising:
increasing a power supply voltage provided to the first divider circuit and the second divider circuit responsive to the value of the first selectable divisor being decreased; and providing the new value of the first selectable divisor to the first divider circuit and the new value of the second selectable divisor to the second divider circuit after increasing the power supply voltage provided to the first divider circuit and the second divider circuit.

* * * * *